United States Patent [19]

Rosenlund

[11] Patent Number: 4,637,952

[45] Date of Patent: Jan. 20, 1987

[54] METHOD FOR IMPREGNATING WOOD, AND AN APPARATUS FOR CARRYING OUT THE METHOD

[76] Inventor: Terje Rosenlund, Båtstangveien 12, N-3200 Sandefjord, Norway

[21] Appl. No.: 789,970

[22] PCT Filed: Feb. 1, 1985

[86] PCT No.: PCT/NO85/00007

§ 371 Date: Oct. 2, 1985

§ 102(e) Date: Oct. 2, 1985

[87] PCT Pub. No.: WO85/03474

PCT Pub. Date: Aug. 15, 1985

[30] Foreign Application Priority Data

Feb. 2, 1984 [NO] Norway ................ 840397

Sep. 14, 1984 [NO] Norway ................ 843660

[51] Int. Cl.⁴ .................. B05C 3/00; B05D 1/18; B05D 3/00; C23C 14/00

[52] U.S. Cl. .................. 427/297; 118/50; 118/429; 427/440

[58] Field of Search .................. 118/50, 50.1, 429; 427/297, 298, 440

[56] References Cited

U.S. PATENT DOCUMENTS 4,337,720 7/1982 Hager .................. 118/50

4,433,031 2/1984 Allen .................. 427/297 X 4,466,998 8/1984 McIntyre .................. 427/297

4,542,046 9/1985 Moldrup .................. 118/50 X

FOREIGN PATENT DOCUMENTS 1399833 7/1975 United Kingdom .

*Primary Examiner*—Michael R. Lusignan

*Attorney, Agent, or Firm*—Holman & Stern

[57] ABSTRACT

A method for impregnating wood, wherein the wood (1) is placed in an airtight impregnation tank (2) from which the air has been evacuated, and which is subjected to pressure after the introduction of the impregnating liquid (17). The impregnating liquid is introduced under completely airtight conditions, whereby the liquid (17) is devoid of gas and air when impregnation takes place. An apparatus for carrying out the method comprises an impregnation tank (2) for containing the wood (1), wherein the tank is provided with pipes connecting it to a storage tank (11) containing impregnating liquid (17) for supplying the liquid to the impregnation tank. In connection with the impregnation tank (2) and the storage tank (11), equipment for evacuating the air or other gas from the tanks, from the wood and from the impregnating liquid (17). In connection with the impregnation tank (2) equipment is provided for increasing the pressure in the tank, e.g. by reducing the volume of the impregnation tank or by introducing additional liquid by means of a pressure pump.

11 Claims, 1 Drawing Figure

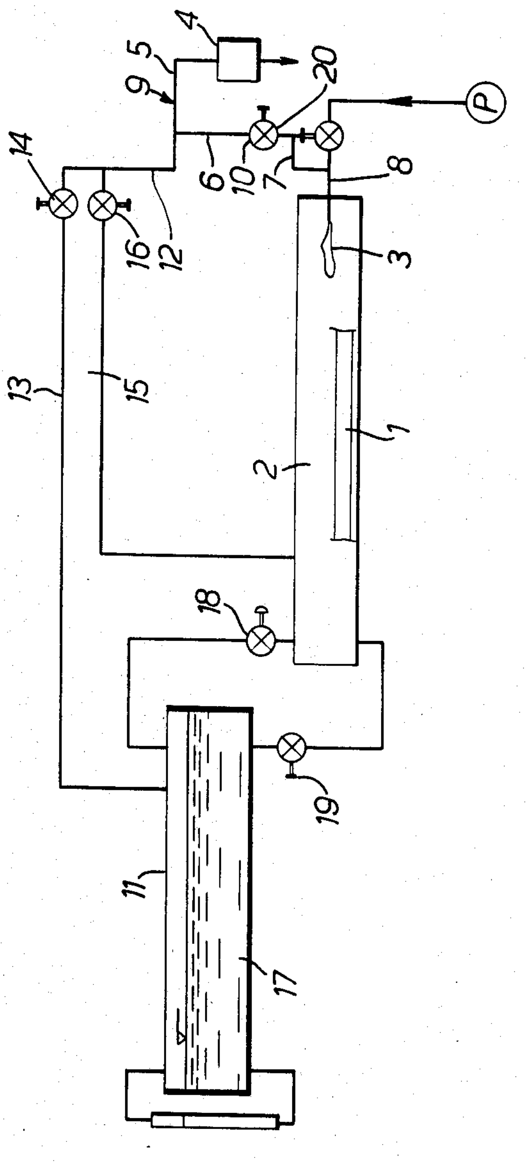
1
2
3
4
5
6
7
8
9
10
11
12
13
14
15
16
17
18
19
20
P

METHOD FOR IMPREGNATING WOOD, AND AN APPARATUS FOR CARRYING OUT THE METHOD

CROSS REFERENCE TO RELATED APPLICATION

This U.S. application stems from PCT International Application No. PCT/NO 85/00007 filed Feb. 1, 1985.

The present invention relates to a method for impregnating wood by means of an impregnating liquid, and an apparatus for carrying out the method.

Treatment of wood materials by pressure impregnation or deep impregnation has been known for some time. The object is to make the wood more resistant to rot, fungus attack and woodboring insects. The impregnating agent is normally a liquid containing various dissolved salts, which usually have a certain toxic effect.

In the method most commonly practiced today, dry wood is placed in a pressure vessel and the tank is subjected to vacuum. The purpose of this is to draw out as much of the air in the cells of the wood as possible. Thereafter, impregnating liquid is introduced at atmospheric pressure into the impregnation tank from a special storage tank. By suction, the wood will then absorb the impregnating liquid. A drawback of this method is that the woody's ability to absorb the impregnating liquid is considerably reduced because it takes a certain amount of time before the wood is completely surrounded by the impregnating liquid. In the interim period, before the materials are completely surrounded by the liquid, the wood will absorb air and the cells of the wood will fill with air instead of the liquid. Therefore, the pressure outside and inside the cell walls will be equalized to a great degree, and the impregnating liquid achieves rather poor penetration into the wood.

Upon closer examination of this known process, it has been observed that in spite of the fact that the wood loses a major part of the gas volume contained in its cells, not all of the volume once occupied by this gas is replaced by the impregnating substance, even after the laterials have been completely submersed in the liquid. Since no deformation of the materials occurs, either, it must be assumed that the remaining volume has been taken up by some substance other than the impregnating liquid.

Logically, this substance must be gas. This gas consists in part of air which is absorbed by the wood as the liquid is being added, as discussed above, but in addition, it is likely that gas is also drawn out of the liquid, according to the law of the solubility of gases in liquids in relation to the gas pressure above the liquid. The cell membranes in wood are of such nature that they can confine, for example, glucose molecules, while allowing water molecules to pass through. In other words, small molecules may more easily pass through the membrane than large molecules. A large proportion of the molecules which pass through the membrane into the cells in the known impregnation method, therefore, will be gas molecules from the impregnating liquid, and this reduces the possibility for the liquid molecules in the impregnating substance to penetrate the cells. This naturally leads to poorer penetration of the impregnating liquid in the types of wood, especially pine, which today are considered impregnable by this method. It also means that other important kinds of wood, such as fir, are now considered unsuitable for pressure impregnation treatment, owing to the difference in cell structure of the two conifers. As a result, only pine wood is treated according to the above-described method in Norway, and this limitation naturally constitutes a serious drawback of the method.

The object of the present invention is to improve this method of impregnating wood materials, with the aim of increasing the depth of impregnation and making it possible to impregnate types of wood which heretofore have been considered unsuitable for treatment by pressure impregnation or deep impregnation.

This object is obtained through a method for impregnating wood by means of an impregnating liquid, wherein the wood is placed in an airtight pressure vessel or impregnation tank from which the air has been completely or almost completely evacuated, and the impregnation liquid, following its introduction into the tank, is subjected to pressure, and the method is characterized in that the impregnating liquid is completely or almost completely de-aerated of its gas and/or air content prior to being compressed in the impregnation tank, and that impregnation takes place under completely airtight conditions, such that the liquid is completely or almost completely devoid of gas and air when impregnation takes place, i.e., upon penetration of the liquid into the wood, and gas and/or air have no opportunity to penetrate into the wood between the evacuation of the tank and impregnation of the wood.

The basic idea of the invention is that the vacuum in the wood, or more correctly in the cells of the wood, is established and maintained prior to and during the introduction of the liquid, causing the impregnating liquid to be "sucked up" through the cell walls, thus filling the cells with impregnating liquid. Therefore, there is no opportunity for an equalization of pressure between the cells and the surroundings to occur prior to the penetration of the impregnating liquid through the cell walls.

In a practical embodiment of the method, de-aeration or removal of the air content from the impregnating liquid takes place in a separate tank.

In a further development of the method, the compression of the impregnating liquid, after it has been introduced into the impregnation tank, is produced by reducing the volume in the impregnation tank, or by introducing an air/gas-free liquid under pressure.

A somewhat modified embodiment of the method involves introduction of the impregnating liquid into the tank prior to evacuation, whereby the wood is completely submerged in the liquid prior to evacuation of the tank, and the liquid and the wood material being impregnated are thereafter subjected to pressure.

In a further feature of the method, the liquid can be enclosed in an elastic case within the tank. The space between the pressure resistant tank shell and the elastic container is first evacuated, then the interior of the elastic case is evacuated to about 95% vacuum or higher, and pressure is thereafter introduced into the space between the pressure resistant tank shell and the elastic case, utilizing a pressure of about 4 bar or higher, as known per se.

Yet another characterizing feature of the method of the invention is that vacuum is produced in an expansion tank communicating via a pipe with the impregnation tank, the expansion tank being closed off from the tank during evacuation by means of a valve, and the valve is opened after the desired vacuum has been achieved in the expansion tank, thereby lowering the pressure in the tank.

An apparatus for carrying out the method comprises an impregnation tank for containing the wood that is to be impregnated and including the necessary equipment for producing a vacuum in the tank, and pipes connecting the impregnation tank to a storage tank containing the impregnating liquid, for supplying the liquid to the impregnation tank after the latter has been evacuated, and the most important characterizing features of the apparatus are that, in connection with the storage tank, equipment is provided for completely or almost completely evacuating the air or other gas from the tank and from the impregnating liquid contained therein, and in connection with the impregnation tank, equipment is provided for increasing the pressure in the tank under completely airtight conditions.

In a practical embodiment of the apparatus of the invention, the equipment for increasing the pressure in the impregnation tank consists of a means for reducing the volume in the tank, which can be achieved, for example, by arranging one or more inflatable, elastic bladders in the tank or in a liquid-conducting pipe provided in connection with the tank, or by providing one or more displacement pistons, or by providing a pressure pump in the pipe between the storage tank and the impregnation tank.

The invention will be described in more detail in the following with reference to the accompanying drawing, which shows an exemplary embodiment of an apparatus for carrying out the method of the invention.

The wood 1 to be impregnated is placed in an airtight, pressure resistant impregnation tank 2. One or more elastic containers 3 are disposed inside the impregnation tank 2. Prior to initiating impregnation of the wood 1, the air in the container 3 is evacuated by means of a vacuum pump 4 via the pipes 5, 6, 7 and 8, while valves 9, 10 in the pipes are open. After the air has been evacuated, the valve 10 is closed. Thereafter, a storage tank 11 communicating with the vacuum pump 4 via pipes 12 and 13 is evacuated by opening a valve 14, which is subsequently closed when evacuation has been accomplished. By means of the vacuum pump 4, the air in the impregnation tank 2 is then evacuated via the pipes 5, 12 and 15, the valves 9 and 16 being open until the desired evacuation has been obtained, and then closed. All or virtually all of the air or other gas has now been evacuated from both the impregnation tank 2 and the storage tank 11, which also operates as an expansion tank, and the air or gas fraction has also been almost completely removed from the impregnating liquid 17 contained in the storage tank 11.

The impregnation process is initiated by opening the valves 18 and 19, which allows the impregnation tank 2 to be filled with impregnating liquid from the tank 11, the storage tank 11 being situated at a higher elevation than the impregnation tank 2. During the transfer of liquid, the tank 11 is subjected to suction by means of the vacuum pump, the valves 9 and 14 being open, until such time as the gas pressure in the liquid is equal to the gas pressure above the liquid. The valves 18 and 19 are then closed.

From a source of compressed air P, a pressure medium is introduced through a valve 20 to the elastic container 3, causing this to expand until the pressure within the tank 2 rises to 16 bar or higher. After this pressure has been maintained for a sufficient length of time, depending on the volume and nature of the material being impregnated, the pressure is lowered, and the impregnating liquid is evacuated from the tank 2. The container 3 is connected to the vacuum pump and emptied.

If the materials have absorbed too much liquid, vacuum can again be applied to the tank 2 for drawing out the excess impregnation liquid from the wood.

When evacuating the tank 2, the pressure ought to be lowered to or almost to the boiling point of the impregnating liquid as rapidly as possible, whereupon the valves 18 and 19 are immediately opened for introducing the impregnating liquid to the tank.

The apparatus described and illustrated hereinabove is exemplary in character, and it can be altered in a number of ways without departing from the scope of the invention as disclosed in the appurtenant patent claims. Thus, a displacement piston, for instance, could be provided instead of the elastic container for reducing the volume and thereby increasing the pressure in the impregnation tank. The pipe system for pumping out the air and gas in the tanks can be made in various ways, for example using two pumps.

The pressure increase in the impregnation tank 2 can also be achieved by providing a pump unit in the tank 11 or in a conduit between this tank and the impregnation tank, which pumps liquid from the tank 11 to the impregnation tank 2, under such conditions that the liquid will not come in contact with gas or air. The pressure in the impregnation tank 2 will then rise to the desired value, while the pressure in the tank 11 will drop. Since the pressure in the tank 11, owing to the evacuation, is already at the liquid's boiling point, the surface of the liquid will boil. The loss in volume will thus be compensated by liquid vapor.

I claim:

1. A method for impregnating wood by means of an impregnating liquid, comprising placing wood in an airtight, pressure resistant impregnation tank from which air is completely or almost completely evacuated, and subjecting impregnating liquid, following its introduction into the tank, to pressure, wherein the impregnating liquid is completely or almost completely de-aerated of its gas or air content before it is compressed in the impregnation tank, and wherein impregnation occurs under completely airtight conditions so that the impregnating liquid is completely or almost completely devoid of gas and air during impregnation when the liquid is penetrating into the wood, and gas or air has no opportunity to penetrate into the wood between the evacuation of the tank and impregnation of the wood.

2. The method according to claim 1, wherein the impregnation liquid (17) is de-aerated by application of vacuum in a separate storage tank, and thereafter introduced into the impregnation tank.

3. The method according to claim 1, wherein the compression of the impregnating liquid (17) following its introduction into the impregnation tank is produced by reducing the volume in the impregnation tank, or by introducing an air/gas-free liquid under pressure.

4. The method according to claim 1, wherein the impregnating liquid is introduced into the tank prior to evacuation, such that the wood materials are completely submerged in the liquid prior to evacuation of the tank, and that the liquid and wood are thereafter subjected to pressure.

5. The method according to claim 4, wherein the liquid is enclosed in an elastic case within the impregnation tank.

6. The method according to claim 1, wherein the space between the pressure resistant tank shell and the elastic case or hose is first evacuated, then the interior of the elastic container or hose is evacuated to about 95% vacuum or higher, and that pressure is thereafter introduced into the space between the pressure resistant tank shell and the elastic container or hose, at a pressure, as known per se, of about 4 bar or higher, the already de-aerated impregnating liquid being introduced into the interior of the elastic container.

7. The method according to claim 4, wherein by evacuating with a vacuum pump an expansion tank that communicates via a pipe with the impregnation tank, said expansion tank being closed off from the impregnation tank during evacuation by means of a valve, and opening the valve after the desired vacuum has been achieved in the expansion container, thereby lowering the pressure in the tank.

8. An apparatus for impregnating wood comprising an impregnation tank for containing the wood to be impregnated and means for producing a vacuum in the tank, and pipes connecting the tank to a storage tank containing impregnating liquid for supplying the impregnating liquid to the impregnation tank after the latter has been evacuated wherein said means for producing vacuum completely or almost completely evacuates the air or other gas from the tank and from the impregnating liquid, and wherein said impregnation tank is provided with means for increasing the pressure in the tank under completely airtight conditions.

9. The apparatus according to claim 8, wherein the equipment for increasing the pressure in the impregnation tank (2) consists of a means for reducing the volume of the impregnation tank, for example, one or more inflatable, elastic bladders (3) arranged in the tank (2) or in a liquid-conducting pipe connected to the tank.

10. An apparatus according to claim 8, wherein a common vacuum pump (4) is provided for the storage tank (11) and the impregnation tank (2).

11.The apparatus according to claims 8, wherein the provision of a pressure pump for introducing the previously de-aerated impregnating liquid from the storage tank to the impregnation tank.

* * * * *